(12) United States Patent
Su

(10) Patent No.: US 8,269,115 B2
(45) Date of Patent: Sep. 18, 2012

(54) COMPOSITE MATERIAL AND HIGH-FREQUENCY CIRCUIT SUBSTRATE MADE THEREFROM

(75) Inventor: Min She Su, Dongguan (CN)

(73) Assignee: Guangdong Shengyi Sci. Tech Co., Ltd., Dongguan (CN)

( * ) Notice: Subject to any disclaimer, the term of this patent is extended or adjusted under 35 U.S.C. 154(b) by 418 days.

(21) Appl. No.: 12/584,596

(22) Filed: Sep. 9, 2009

(65) Prior Publication Data

US 2010/0258340 A1  Oct. 14, 2010

(30) Foreign Application Priority Data

Apr. 10, 2009  (CN) .......................... 2009 1 0106628

(51) Int. Cl.
  *H05K 1/09* (2006.01)
(52) U.S. Cl. ...................................................... 174/257
(58) Field of Classification Search .................. 174/257, 174/252, 254, 255, 258, 262, 266; 428/297.4, 428/375, 396, 413, 414–418
  See application file for complete search history.

(56) References Cited

U.S. PATENT DOCUMENTS 7,989,561 B2 * 8/2011 Hayashi et al. ............... 525/486

\* cited by examiner

*Primary Examiner* — Jeremy Norris
*Assistant Examiner* — Tremesha S Willis
(74) *Attorney, Agent, or Firm* — Weiner & Burt, P.C.; Irving M. Weiner; Pamela S. Burt

(57) ABSTRACT

The invention relates to a composite material and a high-frequency circuit substrate made from the composite material. The composite material includes: a thermosetting composition in an amount of 20 to 70 by weight with respect to the composite material, a fiberglass cloth processed by a coupling agent; a powder filler; a fire retardant and a cure initiator. The thermosetting composition includes a resin with molecular weight thereof being less than 11,000, and a low-molecular-weight solid allyl resin. The resin is composed of carbon and hydrogen elements. More than 60 percent of the resin is vinyl. The high-frequency circuit substrate made from the composite material comprises: a plurality of prepregs mutually overlapped and copper foils covered on both sides of overlapped prepregs, wherein each prepeg is made from the composite material.

8 Claims, No Drawings

COMPOSITE MATERIAL AND HIGH-FREQUENCY CIRCUIT SUBSTRATE MADE THEREFROM

FIELD OF THE INVENTION

The invention relates to a composite material and a high-frequency circuit substrate made therefrom, particularly to a thermosetting dielectric composite material, and a high-frequency circuit substrate made therefrom.

BACKGROUND OF THE INVENTION

In recent years, with the development of high-properties and networking of computer and information communication equipment, to reach high-speed transmission and deal with large-capacity information, operation signals tend to be high-frequency. Therefore, the material of the circuit substrate material is required to improve.

Among the conventional materials used for the printed circuit substrate, the epoxy resin with excellent adhesion characteristics is widely used. However, the epoxy resin circuit substrate has relatively high dielectric constant and dielectric loss tangent (dielectric constant is more than 4, dielectric loss tangent is around 0.02), and inadequate high-frequency characteristics, which results in failure in meeting the requirement of high-frequency signals. Therefore, it is require to use resins with excellent dielectric properties. That's, the resin has low dielectric constant and dielectric loss tangent. For a long time, technicians in the field have studied thermosetting polybutadiene or butadiene copolymer resin with excellent dielectric properties. The results of these studies are cited as follows:

U.S. Pat. No. 6,569,943 disclosed to use amine modifer polybutadiene liquid resin with vinyl added with monomers of low molecular weight as curing agent and diluent, and use impregnates fiberglass cloth to make circuit substrate. Although the dielectric properties are excellent, the resin system is liquid at normal temperature, and so can not be made into tack-free prepreg. Therefore, in the compression moulding of sheet, it is difficult to adopt common stacked technology of prepreg, which results in difficult process operation.

U.S. Pat. No. 5,571,609 disclosed to use 1,2-polybutadiene resin or polyisoprene with molecular weight less than 5,000, and nonpolar butadiene styrene copolymer with high molecular weight, added with many silica as filler, and use fiberglass cloth as reinforcing material to make circuit substrate. Although it has excellent dielectric properties, the processing property of the process of making the prepreg gets bad, because contents of high molecular weight are adopted to solve the tacky problem of prepreg in this patent. Furthermore, since the proportion of the rigid benzene ring in the resin molecules of the whole resin system is very low, and since the cross-linked chain segments mostly are composed of methylenes with low rigidity, the made substrate has bad rigidity, and the bending strength is very low.

SUMMARY OF THE INVENTION

An object of the present invention is to provide a composite material which comprises a high content vinyl containing resin composed of carbon and hydrogen element, and a low-molecular-weight allyl novolac resin employed as the curing agent, thereby providing a high-frequency circuit substrate with adequate high-frequency dielectric properties, high temperature resistance and good technical formability.

Another object of the present invention is to provide a high-frequency circuit substrate made by the above mentioned composite material, having high-frequency dielectric properties, high temperature resistance and high peel strength of circuit substrate and adopting common automatic stacked technology of prepreg in the compression moulding of sheet, whereby process operation is simple and convenient.

To achieve the above objects, a composite material of the present invention comprises:

(1) a thermosetting composition in an amount of 20 to 70 by weight with respect to the composite material (according to the total weight of composite material), the thermosetting composition including a liquid resin composed of carbon and hydrogen element, more than 60 percent of the liquid resin being vinyl, the molecular weight of the liquid resin being less than 11,000; the thermosetting composition also including a low-molecular-weight solid allyl resin;

(2) a fiberglass cloth processed by coupling agent in an amount of 10 to 60 by weight with respect to the composite material;

(3) a powder filler in an amount of 0 to 55 by weight with respect to the composite material; and (4) a cure initiator in an amount of 1 to 3 by weight.

A high-frequency circuit substrate of the present invention comprises: a plurality of prepregs mutually overlapped and copper foils respectively disposed at both sides of the overlapped prepregs, wherein said prepregs are all made from said composite material by automatic stacked operation.

The beneficial effects of the present invention are described as follows. Firstly, a high content vinyl containing resin composed of carbon and hydrogen element having excellent dielectric properties is used whereby through many unsaturated double bond in the resin for cross-linking reaction, the circuit substrate has the necessary high-frequency dielectric properties and high temperature resistance.

Secondly, the allyl resin that has rigid segments such as a benzene ring in the molecular structures used as the curing agent to improve heat resistance and rigidity of the circuit substrate, and to reduce the temperature of the molding process.

Thirdly, different from using materials with high molecular weight to improve the tacky problem of the prepregs in prior art, the present invention uses the low-molecular-weight allyl resin that is solid at normal temperature together with the high content vinyl containing resin composed of carbon and hydrogen element, so as to improve the tacky problem of the prepregs caused by only using liquid resin. Furthermore, because of using the low-molecular-weight solid allyl resin, the technical fluidity of the resin system is increased, so as to make the substrates produced later better.

In short, the composite material of the prevent invention realizes easy manufacture of the prepreg. The high-frequency circuit substrate manufactured by the composite material has low dielectric constant and low dielectric loss tangent, and excellent heat resistance, and is convenient to process operation. So the composite material is suitable for manufacturing the circuit substrate for a high-frequency electronic equipment.

DESCRIPTION OF THE PREFERRED EMBODIMENTS

The present invention is best understood from the following detailed description with reference to the accompanying embodiments.

I. Components of the Composite Material

1. The Resin System of the Thermosetting Composition

The thermosetting composition in an amount of 20 to 70 by weight with respect to the total weight of the composite material, and preferably in an amount of 20 to 50 by weight, comprises: (1) a resin composed of carbon and hydrogen element with molecular weight less than 11,000, more than 60 percent of the resin being vinyl; (2) a low-molecular-weight solid allyl resin.

Component (1) is a resin composed of carbon and hydrogen element with molecular weight less than 11,000, and more than 60 percent of the resin is vinyl. The resin preferably is butadiene styrene copolymer resin or polybutadiene resin with molecular weight less than 11,000, and preferably less than 7,000. The resin is liquid at normal temperature (room temperature), and the viscosity of liquid resin is very low, therefore it is beneficial to the impregnation operation. The more than 60 percent of vinyl containing resin composed of carbon and hydrogen element with molecular weight less than 11,000 is in an amount of 30 to 75 by weight with respect to total weight of the thermosetting composition. The content of 1,2-addition vinyl is more than 60 percent in its molecular structure, and preferably more than or equal to 70 percent. The high content vinyl containing resin composed of carbon and hydrogen element can provide a great quantity of unsaturated vinyl for curing cross-linked reaction, can increase cross-linking density in curing process, and can provide the circuit substrate with adequate high temperature resistance. The preferable butadiene styrene copolymer resin is the Ricon 104H (made by Sartomer Company) and Ricon 100 resin (by Sartomer Company) with the content of the 1,2-addition vinyl in its molecular structure more than or equal to 70%. The preferable polybutadiene resin is the Ricon 153 (by Sartomer Company) and Ricon 154 (by Sartomer Company).

Component (1) are all liquid at room temperature. If the prepregs are only made by them, the tacky problem will appear, which is not beneficial to the following lamination process operation. So the solid component (2) is introduced to improve the tacky problem of the prepregs.

Component (2) is a low-molecular-weight solid allyl resin. By adding the low-molecular-weight solid allyl resin, on one hand, since the solid allyl resin is used together with the high content vinyl containing resin composed of carbon and hydrogen element, the tacky problem of the prepregs caused by only using liquid resin is improved; on the other hand, since the solid allyl resin comprises better rigid benzene ring in its molecular structure, comparing with the butadiene resin in the prior art, the rigid and mechanical strength of the made sheet is better. The low-molecular-weight solid allyl resin is in an amount of 25 to 70 by weight with respect to the thermosetting composition. The low-molecular-weight solid allyl resin in an amount less than 25 can not improve the tacky problem. The low-molecular-weight solid allyl resin in an amount more than 70 makes dielectric properties deteriorate, and makes the brittleness of the composite material increase. The low-molecular-weight solid allyl resin is selected from allyl novolac resin, allyl epoxy resin, allyl bisphenol A modified benzoxazine resin, allyl phenol modified benzoxazine resin, allyl cresol modified benzoxazine resin or a combination thereof. Preferably, the low-molecular-weight solid allyl resin is allyl novolac resin, of which the structural formula is shown as follows.

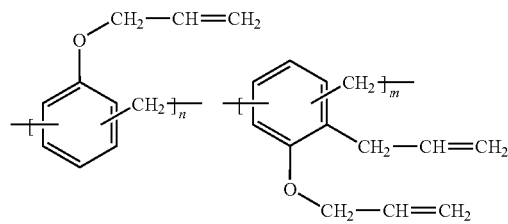

2. Powder Filler

In the composite material of the present invention, the powder filler is employed to increase solid content of the glue liquid, improve the tack-free properties of the prepreg, improve the dimensional stability, and reduce CTE. The powder filler of present invention is in an amount of 0 to 55 by weight with respect to the composite material,(according to the total weight of composite material). The powder filler can be selected from crystalline silica, amorphous silica, spherical silica, titanium dioxide, strontium titanate, barium titanate, boron nitride, aluminium nitride, silicon carbide, aluminum, glass fibers, polyethylene tetrafluoroethylene, polyphenylene Sulfide, Polyether sulfones, and combination thereof. The above powder filler can be used separately or together. Preferably, the powder filler is silica. The particle size medium value of the filler is 1-15 μm, and preferably is 1-10 μm. The filler with the particle size medium value of 1-10 μm has good dispersion in liquid resin. For example, the silica filler is CE441 (by CE minerals company), FB-35 (by Denka company), or 525 (by Sibelco companies).

3. Fiberglass Cloth

In the composite material of the present invention, the fiberglass cloth is processed by coupling agent. The fiberglass cloth processed by coupling agent is employed to improve the size stability of the substrate, and reduce contraction of laminate resin in curing process. The fiberglass cloth is in an amount of 10 to 60 by weight with respect to the composite material (according to the total weight of composite material), and preferably in an amount of 30 to 57. According to different requirements of substrates, different fiberglass clothes can be used. Specifications of different fiberglass clothes are listed in Table 1:

TABLE 1

| kind | thickness (mm) | manufacturer |
| --- | --- | --- |
| 7628 | 0.18 | Shanghai honghe |
| 2116 | 0.094 | Shanghai honghe |
| 1080 | 0.056 | Shanghai honghe |
| 106 | 0.04 | Shanghai honghe |

4. Flame Retardant

In the present invention, flame retardant can be added to improve the fire-retardant properties of the sheet. The fire retardant of present invention is in an amount of 0 to 35 by weight with respect to the composite material (according to the total weight of composite material). Brominate containing flame retardant or phosphorus containing flame retardant can be used. The preferable flame retardant is not to reduce dielectric properties. The preferable brominate containing flame retardant is decabromodiphenylether, decabromodiphenylethane or ethylenebis tetrabromophthalimide, etc. The preferable phosphorus containing flame retardant is tris (2,6-dimethylphenyl)phosphine, 10-(2,5-dihydroxyphenyl)-9,10-dihydro-9-oxa-10-phosphaphenanthrene-10-Oxide, 2,6-bis(2,6-dimethylphenyl)phosphino benzene, or 10-phenyl-9,10-dihydro-9-oxa-10-phosphaphenanthrene-10-oxide, etc.

5. Cure Initiator

In the composite material of the present invention, the cure initiator is employed to accelerate reaction. When the composite material is heated, the cure initiator is decomposed into free radicals which enable the molecular chain of the polymer to cross-link. The cure initiator is in an amount of 1% to 10% with respect to the amount of thermosetting composition, and is roughly in an amount of 1 to 3 by weight with respect to the composite material (according to the total weight of composite material). The cure initiator is selected from the materials producing free radicals. The preferable cure initiator is dicumyl peroxide, tert-butyl peroxybenzoate or 2,5-bis(2-ethylhexanoylperoxy)-2,5-dimethylhexane and so on.

6. Auxiliary Crosslinking Agent

In the composite material of the present invention, a certain amount of auxiliary crosslinking agent can be added to improve cross-linking density. For example, the auxiliary crosslinking agent can be selected from triallyl isocyanurate, triallyl cyanurate, divinylbenzene or multifunction acrylate and so on.

II: High-frequency Circuit Substrate Made from the Composite Material

A making method of high-frequency circuit substrate made from the composite material, including the following steps:

Step 1: providing components of composite material, the components comprising: (1) a thermosetting composition in an amount of 20 to 70 by weight with respect to the composite material (according to the total weight of composite material), the thermosetting composition including a liquid resin composed of carbon and hydrogen element, more than 60 percent of the liquid resin being vinyl, the molecular weight of the liquid resin being less than 11,000; and a low-molecular-weight solid allyl resin; (2) a fiberglass cloth processed by coupling agent in an amount of 10 to 60 by weight with respect to the composite material; (3) a powder filler in an amount of 0 to 55 by weight with respect to the composite material; (4) a cure initiator in an amount of 1 to 3 by weight with respect to the composite material.

Step 2: mixing the thermosetting composition, the powder filler, a flame retardant and the cure initiator, diluting the resin system to an appropriate viscosity with solvent, evenly stirring and mixing to make the filler evenly disperse in the resin system, thereby obtaining a glue solution, impregnating the fiberglass cloth in the glue solution, controlling the fiberglass cloth to be an appropriate thickness, then removing the solvent to form prepregs.

Step 3: mutually overlapping a plurality of prepregs, respectively covering a copper foil on both top and bottom surfaces of the overlapped prepregs, putting them into a press machine to cure with curing temperature of 150° C.~250° C. and curing pressure of 25 Kg/cm²~70 Kg/cm², thereby forming the high-frequency circuit substrate. This step can be implemented by conventional automatic stacked operation.

The high-frequency circuit substrate comprises: a plurality of prepregs mutually overlapped and copper foils respectively covered on both sides of overlapped prepregs. Each prepreg is made from the composite material.

The properties of the above high-frequency circuit board, such as dielectric properties (dielectric constant and dielectric loss tangent), high-frequency properties and heat resistance, will be best understood from the following detailed explain and description with reference to the accompanying embodiments.

The selected components of composite material in the embodiments of present invention is listed in Table 2:

TABLE 2

| Manufacturer | Name or trademark | The content of the material |
| --- | --- | --- |
| Sartomer | Ricon 100 | polybutadiene styrene copolymer resin, Mn = 4500, 1,2-vinly = 70% |
| Sibelco | 525 | amorphous silica |
| Albemarle | SAYTEX8010 | decabromodiphenylethane |
| Shanghai gaoqiao | DCP | dicumyl peroxide |
| Shanghai honghe | 1080 Fiberglass cloth | thickness 0.05 mm, weight 48 g/m² |

Embodiment 1

Step 1

90.00 g (0.21 mol) novolac resin and 135 g n-butanol are added to a 500 ml three-neck flask provided with mechanical agitator, condenser tube, and thermograph. 29.87 g (0.44 mol) KOH is added after the novolac resin has totally dissolved. After reaction lasts for 2 h, 42.41 g (0.44 mol) allyl chloride is added in drops. Then reaction lasts for 6 h. After the reaction is over, the hot solution is filtered. The filtered product is washed with butanol to be white. Then the solvent is eliminated by vacuum distillation (100° C., 0.08 MPa). The product is washed with tenfold deionized water to have the PH value of 7. Then the water is eliminated by vacuum distillation (100° C., 0.08 MPa) thereby making allyl novolac resin.

Step 2

Butadiene styrene copolymer liquid resin Ricon100 in an amount of 55.6 by weight, allyl novolac resin made in Step 1 in an amount of 44.4 by weight, silica (525) in an amount of 85 by weight, fire retardant SAYTEX8010 in an amount of 32 by weight, cure initiator DCP in an amount of 2.4 by weight are mixed and diluted to an appropriate viscosity with solvent xylene, and then evenly stirred and mixed to make the filler evenly disperse in the resin system, thereby obtaining a glue solution. The fiberglass cloth 1080 is provided and impregnated with the glue solution. Then fiberglass cloth is dried to remove the solvent thereby forming prepregs. Since the prepreg is non-tacky, the process operation is simple. Eight prepregs are overlapped, and two copper foils with thickness of 1 oz separately cover on both top and bottom surfaces of the overlapped prepregs. The assembly of two copper foils and eight prepregs is put into a press machine to cure for 2 hours with curing pressure of 50 Kg/cm² and curing temperature of 190° C. The physical data are shown in Table 3.

Embodiments 2, 3

The process of embodiments 2, 3 is similar to embodiment 1, but the ratio of the composite material in Step 2 is changed as shown in Table 3.

COMPARISON EXAMPLE

The process of comparison example is similar to embodiment 1. Allyl novolac resin is eliminated. The ratio of the material is shown in Table 3. The mold temperature is 300° C. and keep the temperature for 30 minutes.

TABLE 3

| Materials and Properties | Embodiment 1 | Embodiment 2 | Embodiment 3 | Comparison example |
|---|---|---|---|---|
| Ricon 100 | 55.6 | 62 | 38 | 100 |
| allyl novolac resin | 44.4 | 38 | 52 | 0 |
| 525 | 85 | 240 | 45 | 85 |
| DCP | 6.5 | 7.5 | 5.6 | 5.8 |
| SAYTEX8010 | 32 | 35 | 0 | 28 |
| 1080Fiberglass cloth | 80.7 | 125 | 78 | 92 |
| peel strength (N/mm) | 0.94 | 0.91 | 1.03 | 0.52 |
| dielectric constant (10 GHZ) | 3.48 | 3.82 | 3.56 | 3.15 |
| dielectric loss tangent (10 GHZ) | 0.0053 | 0.0063 | 0.0065 | 0.0026 |
| solder leach resistance 288° C., (s) | >120 | >120 | >120 | >120 |
| tacky property of the prepreg | not tacky | not tacky | not tacky | tacky |
| bending strength (Mpa) | 380 | 320 | 420 | 260 |
| T288 (min.) | >15 | >15 | >15 | 2 |

Physical Analysis

From the physical data of Table 3, the circuit substrates made in embodiments 1, 2 and 3 have low dielectric constant, low dielectric loss tangent, and excellent high-frequency properties. Comparing embodiments 1, 2 and 3 with comparison example, low-molecular-weight allyl novolac resin is introduced to effectively improve the tacky problem of prepreg, and increase the bending strength. At the constant temperature of 288° C., it can endure the heat for 15 minutes without delamination. So, it has good heat resistance, and also has low dielectric constant and dielectric loss tangent. In addition, due to the introduction of low-molecular-weight allyl novolac resin, the mold temperature can be 190° C., which is much less than the mold temperature of 300° C. of the comparison example.

As mentioned above, comparing with the general circuit substrate, the circuit substrate made from the composite material of the present invention has more excellent dielectric properties (low dielectric constant and low dielectric loss tangent), and has excellent high-frequency properties.

Although the present invention has been described in detail with above said preferred embodiments, but it is not to limit the scope of the invention. So, all the modifications and changes according to the characteristic and spirit of the present invention, are involved in the protected scope of the invention.

What is claimed is:

1. A composite material comprising:
   (1) a thermosetting composition in an amount of 20 to 70 by weight with respect to the composite material according to the total weight of composite material, the thermosetting composition including a liquid resin composed of carbon and hydrogen elements, and a low-molecular-weight solid allyl resin, more than 60 percent of the liquid resin being vinyl, the molecular weight of the liquid resin being less than 11,000;
   (2) a fiberglass cloth processed by a coupling agent in an amount of 10 to 60 by weight with respect to the composite material;
   (3) a powder filler in an amount of 0 to 55 by weight with respect to the composite material; and
   (4) a cure initiator in an amount of 1 to 3 by weight with respect to the composite material;
   wherein said liquid resin is in an amount of 30 to 75 by weight with respect to the thermosetting composition, and has 1,2-addition with vinyl; the content of vinyl is preferably more than or equal to 70%;
   wherein said low-molecular-weight solid allyl resin is in an amount of 25 to 70 by weight with respect to the thermosetting composition, and said low-molecular-weight solid allyl resin is selected from allyl novolac resin, allyl epoxy resin, allyl bisphenol A modified benzoxazine resin, allyl phenol modified benzoxazine resin, allyl cresol modified benzoxazine resin or a combination thereof.

2. The composite material of claim 1, wherein said liquid resin is cured and cross-linked with low-molecular-weight allyl resin.

3. The composite material of claim 1, wherein said powder filler is selected from crystalline silica, amorphous silica, spherical silica, titanium dioxide, strontium titanate, barium titanate, boron nitride, aluminium nitride, silicon carbide, aluminum, glass fiber, polytetrafluoroethylene, Polyphenylene Sulfide, Polyether sulfones or a combination thereof.

4. The composite material of claim 1, further comprising a brominate or phosphorus containing flame retardant.

5. The composite material of claim 4, wherein said brominate containing flame retardant is selected from decabromodiphenyl ether, decabromodiphenylethane or ethylenebis tetrabromophthalimide; said phosphorus containing flame retardant is selected from tris(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl)phosphino benzene or 10-phenyl-9,10-dihydro-9-oxa-10-phosphaphenanthrene-10-oxide.

6. The composite material of claim 1, wherein said cure initiator is selected from materials capable of producing free radicals; said cure initiator is preferably selected from dicumyl peroxide, tert-butyl peroxybenzoate or 2,5-bis(2-ethylhexanoylperoxy)-2,5-dimethylhexane.

7. The composite material of claim 1, further comprising an auxiliary crosslinking agent, wherein said auxiliary crosslinking agent is selected from triallyl isocyanurate, triallyl cyanurate, divinylbenzene or multifunction acrylate.

8. A high-frequency circuit substrate made from the composite material of claim 1 comprising: a plurality of prepregs mutually overlapped and copper foils respectively disposed at both sides of the overlapped prepregs, said prepregs all being made from said composite material by automatic stacked operation.

* * * * *